US012566215B2

(12) United States Patent
Sung et al.

(10) Patent No.: US 12,566,215 B2
(45) Date of Patent: Mar. 3, 2026

(54) BATTERY APPARATUS AND METHOD FOR ESTIMATING BATTERY STATE

(71) Applicant: LG ENERGY SOLUTION, LTD., Seoul (KR)

(72) Inventors: Yong Chul Sung, Daejeon (KR); Cheoltaek Kim, Daejeon (KR); Incheol Yeom, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 499 days.

(21) Appl. No.: 17/918,980

(22) PCT Filed: Jun. 28, 2021

(86) PCT No.: PCT/KR2021/008095
§ 371 (c)(1),
(2) Date: Oct. 14, 2022

(87) PCT Pub. No.: WO2022/065635
PCT Pub. Date: Mar. 31, 2022

(65) Prior Publication Data
US 2023/0296681 A1      Sep. 21, 2023

(30) Foreign Application Priority Data
Sep. 22, 2020    (KR) ........................ 10-2020-0122153

(51) Int. Cl.
*G01R 31/3842*      (2019.01)
*G01R 31/367*      (2019.01)
(Continued)

(52) U.S. Cl.
CPC ....... *G01R 31/3842* (2019.01); *G01R 31/367* (2019.01); *G01R 31/389* (2019.01);
(Continued)

(58) Field of Classification Search
CPC ........ B60L 3/12; B60L 58/12; B60L 2240/80; B60L 2260/44; G01R 31/367;
(Continued)

(56) References Cited

U.S. PATENT DOCUMENTS 9,728,992 B2 * 8/2017 Takahashi ........... H01M 10/482
12,085,619 B2 * 9/2024 Sung .................... H02J 7/0018
(Continued)

FOREIGN PATENT DOCUMENTS

CN        107066722 A      8/2017
JP       2008-241246 A     10/2008
(Continued)

OTHER PUBLICATIONS

International Search Report (with translation) and Written Opinion dated Oct. 6, 2021, issued in corresponding International Application No. PCT/KR2021/008095.
(Continued)

*Primary Examiner* — Abdulmajeed Aziz
(74) *Attorney, Agent, or Firm* — Morgan, Lewis & Bockius LLP

(57)              ABSTRACT
A battery apparatus receives a measured current of a battery and estimates a surface SOC representing a potential at an electrode surface of the battery based on a plurality of parameters. The plurality of parameters includes a first parameter determined based on the measured current and a second parameter determined based on an SOC of the battery.

17 Claims, 10 Drawing Sheets

(51) Int. Cl.

| | |
|---|---|
| *G01R 31/389* | (2019.01) |
| *H01M 10/42* | (2006.01) |
| *H01M 10/48* | (2006.01) |

(52) U.S. Cl.
CPC ....... *H01M 10/425* (2013.01); *H01M 10/486* (2013.01); *H01M 2220/20* (2013.01)

(58) Field of Classification Search
CPC .............. G01R 31/3842; G01R 31/387; G01R 31/389; H01M 10/425; H01M 10/48; H01M 10/486; H01M 2010/4271; H01M 2220/20; Y02E 60/10; Y02T 10/70
See application file for complete search history.

(56) References Cited

U.S. PATENT DOCUMENTS

| | | | | |
|---|---|---|---|---|
| 2010/0085057 A1 * | 4/2010 | Nishi | .................... | H01M 10/44 |
| | | | | 324/427 |
| 2010/0153038 A1 * | 6/2010 | Tomura | .............. | G01R 31/3842 |
| | | | | 702/63 |
| 2013/0099794 A1 * | 4/2013 | Takahashi | ............. | H01M 10/48 |
| | | | | 324/427 |
| 2014/0009107 A1 * | 1/2014 | Hsia | ........................ | H02J 7/007 |
| | | | | 320/137 |
| 2014/0347012 A1 | 11/2014 | Shim et al. | | |
| 2014/0361743 A1 * | 12/2014 | Lin | ........................ | H02J 7/0016 |
| | | | | 320/109 |
| 2017/0052228 A1 * | 2/2017 | Hariharan | .......... | G01R 31/3842 |
| 2018/0031638 A1 | 2/2018 | Wang et al. | | |
| 2018/0143259 A1 | 5/2018 | Kim et al. | | |
| 2019/0198941 A1 | 6/2019 | Oniki et al. | | |
| 2019/0221897 A1 | 7/2019 | Basu et al. | | |
| 2019/0252898 A1 | 8/2019 | Kim et al. | | |
| 2021/0013731 A1 | 1/2021 | Choe et al. | | |
| 2021/0119464 A1 | 4/2021 | Kim et al. | | |
| 2021/0286008 A1 | 9/2021 | Kim et al. | | |

FOREIGN PATENT DOCUMENTS

| | | | |
|---|---|---|---|
| JP | 2014-032825 A | 2/2014 |
| JP | 2014-147222 A | 8/2014 |
| JP | 2017-062191 A | 3/2017 |
| JP | 2018-088376 A | 6/2018 |
| JP | 6409272 B2 | 10/2018 |
| JP | 2019-114475 A | 7/2019 |
| JP | 2020-077464 A | 5/2020 |
| KR | 10-2017-0022855 A | 3/2017 |
| KR | 10-2018-0057266 A | 5/2018 |
| KR | 10-2019-0015991 A | 2/2019 |
| KR | 10-2019-0097626 A | 8/2019 |
| KR | 10-2020-0069203 A | 6/2020 |

OTHER PUBLICATIONS

Extended European Search Report issued Oct. 13, 20213 in corresponding European Patent Application No. 21872672.7 (Note: US 2017/0052228 A1 was cited in a previously filed IDS.).

Notice of Reasons for Rejection issued Oct. 31, 2023 in corresponding Japanese Patent Application No. 2022-567847 (Note: JP 6409272 B2 and US 2017/0052228 A1 were cited in a previously filed IDS.).

Fan, et al., "A novel State of Health estimation method for Lithium-ion battery in electric vehicles," 2019, Journal of Physics: Conference Series, Institute of Physics Publishing, Bristol, GB, vol. 1187, No. 2, p. 22014 (6 pages total), XP 020340196.

Office Action dated Apr. 18, 2025, issued in corresponding CN Patent Application No. 202180028026.5 (Note—KR 10-2017-0022855 A and US 2017/0052228 A1 cited in this CN Office Action were cited in a prior IDS.).

* cited by examiner

| SOC / Temperature | 100% | · · · · | 5% |
|---|---|---|---|
| -40℃ | K1 | · · · · | K2 |
| ⋮ | ⋮ | | ⋮ |
| 60℃ | K3 | · · · · | K4 |

FIG. 6

| SOC / Temperature | 100% | · · · · | 5% |
|---|---|---|---|
| -40℃ | D1 | · · · · | D2 |
| ⋮ | ⋮ | | ⋮ |
| 60℃ | D3 | · · · · | D4 |

BATTERY APPARATUS AND METHOD FOR ESTIMATING BATTERY STATE

TECHNICAL FIELD

Cross-Reference to Related Application

This application claims priority to and the benefit of Korean Patent Application No. 10-2020-0122153 filed in the Korean Intellectual Property Office on Sep. 22, 2020, the entire contents of which are incorporated herein by reference.

The described technology relates to a battery apparatus and a method for estimating a battery state.

BACKGROUND ART

An electric vehicle or a hybrid vehicle is a vehicle that obtains power by driving a motor mainly using a battery as a power source. The electric vehicles are being actively researched because they are alternatives that can solve pollution and energy problems of internal combustion vehicles. Rechargeable batteries are used in various external devices other than the electric vehicles.

One of important states used when managing a battery is a state of charge (SOC). The SOC is a factor representing a relative ratio of a remaining capacity to a full charge capacity representing a maximum amount of charge that can be stored in the battery. The SOC represents an average concentration of active materials inside the battery.

An equivalent circuit model using the SOC of the battery is mainly used in order to estimate a terminal voltage of the battery. The SOC in the equivalent circuit model is suitable for estimating a state of a battery in a static state, such as an open circuit. However, in situations where the battery is being used dynamically, such as a situation where the battery is continuously being charged or discharged, or a situation where a vehicle mounted with the battery is running, the current effect cannot be reflected so that an error of state estimation may increase.

DISCLOSURE

Technical Problem

Some embodiments may provide a battery management system and a method for estimation a battery state, capable of accurately estimating a battery state and a battery state estimation method.

Technical Solution

According to an embodiment, a battery apparatus including a battery and a processor is provided. The processor receives a measured current of the battery, and estimates a surface SOC representing a potential at an electrode surface of the battery based on a plurality of parameters including a first parameter determined based on the measured current and a second parameter determined based on an SOC of the battery.

In some embodiments, the processor may determine a coefficient based on at least one of a temperature of the battery, the SOC, and the surface SOC, and determine the first parameter by reflecting the coefficient to the measured current.

In some embodiments, the battery apparatus may further include a memory configured to store a correspondence relationship between the coefficient and at least one of the temperature of the battery, the SOC, and the surface SOC. In this case, the processor may determine the coefficient based on the correspondence relationship.

In some embodiments, the processor may determine the second parameter based on a difference between the SOC and the surface SOC that are estimated at a previous time point.

In some embodiments, the processor may determine a coefficient based on at least one of the temperature of the battery, the SOC, and the surface SOC, and determine the second parameter by reflecting the coefficient to a difference between the SOC and the surface SOC.

In some embodiments, the battery apparatus may further include a memory configured to store a correspondence relationship between the coefficient and at least one of the temperature of the battery, the SOC, and the surface SOC. In this case, the processor may determine the coefficient based on the correspondence relationship.

In some embodiments, the processor may estimate the surface SOC at a current time point based on the surface SOC, the first parameter, and the second parameter that are estimated at a previous time point.

In some embodiments, the processor may reflect a time change between the previous time point and the current time point to the first parameter and the second parameter, respectively.

In some embodiments, the processor may estimate a terminal voltage of the battery based on the surface SOC, the SOC, and a current of the battery.

In some embodiments, the processor may estimate an open circuit voltage of the battery based on the surface SOC, estimate an overpotential of the battery based on the SOC and the surface SOC, estimate a voltage due to an ohmic resistance of the battery based on a current of the battery, and estimate the terminal voltage based on the open circuit voltage, the overpotential, and the voltage due to the ohmic resistance.

In some embodiments, the battery apparatus may further include a memory configured to store a correspondence relationship between the SOC as an input and the open circuit voltage as an output. In this case, the processor may estimate the open circuit voltage using the surface SOC as the input of the correspondence relationship.

In some embodiments, the processor may estimate the overpotential based on a ratio or difference between the SOC and the surface SOC.

According to another embodiment, a method of estimating a state of a battery is provided. The method includes determining a first parameter based on a measured current of the battery, determining a second parameter based on an SOC of the battery, and estimating a surface SOC representing a potential at an electrode surface of the battery based on a plurality of parameters including the first parameter and the second parameter.

In some embodiments, determining the first parameter may include determining a coefficient based on at least one of a temperature of the battery, the SOC, and the surface SOC, and determining the first parameter by reflecting the coefficient to the measured current.

In some embodiments, determining the second parameter may include determining a coefficient based on at least one of a temperature of the battery, the SOC, or the surface SOC, and determining the second parameter by reflecting the coefficient to a difference between the SOC and the surface SOC at a previous time point.

In some embodiments, estimating the surface SOC may include estimating the surface SOC at a current time point based on the surface SOC, the first parameter, and the second parameter that are estimated at a previous time point.

In some embodiments, the method may further include estimating a first voltage based on the surface SOC, estimating a second voltage based on the SOC and the surface SOC, estimating a third voltage based on the current of the battery, and estimating a voltage, and estimating a terminal voltage of the battery based on the first voltage, the second voltage, and the third voltage.

According to yet another embodiment, a program configured to be executed by a processor of a battery apparatus and be stored in a recording medium is provided. The program causes the processor to execute determining a first parameter based on a measured current of the battery, determining a second parameter based on an SOC of the battery, and estimating a surface SOC representing a potential at an electrode surface of the battery based on a plurality of parameters including the first parameter and the second parameter.

Advantageous Effects

According to an embodiment of the present invention, it is possible to accurately estimate the state of the battery not only in a static state of the battery but also in a dynamic state in which charging or discharging is repeated.

BRIEF DESCRIPTION OF THE DRAWINGS

FIG. 5 is a diagram showing an example of a correspondence relationship between a temperature/SOC and a kinetics coefficient in a battery according to an embodiment.

FIG. 6 is a diagram showing an example of a correspondence relationship between a temperature/SOC and a diffusion coefficient in a battery according to an embodiment.

MODES FOR INVENTION

Figure 1:
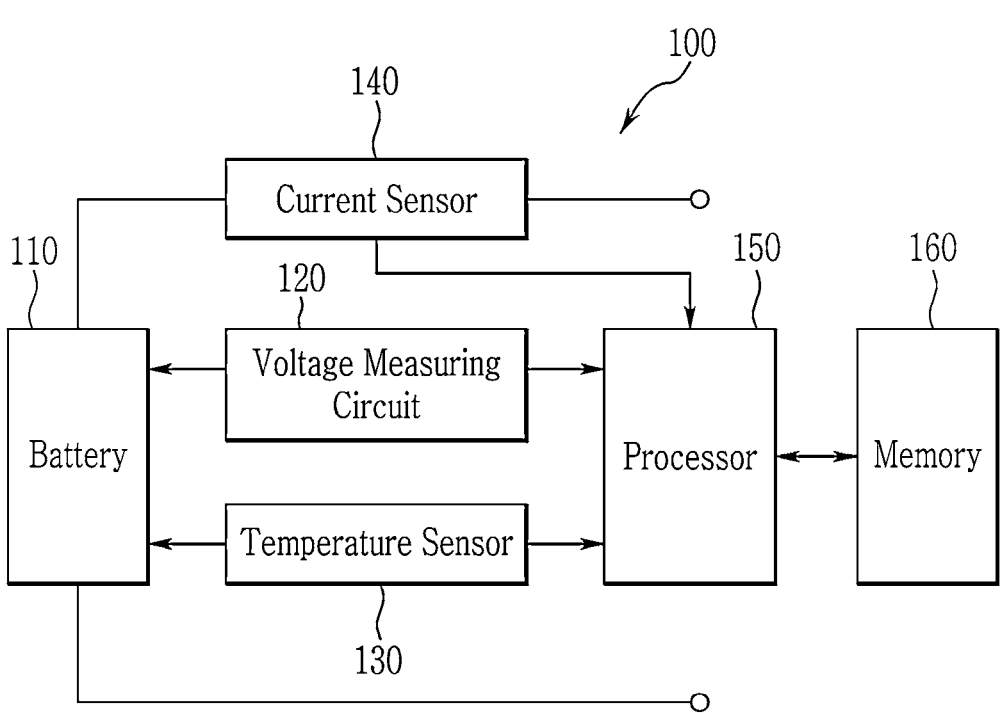
FIG. 1 is a drawing showing a battery apparatus according to an embodiment.

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is "connected" to another element, it should be understood that the element may be directly connected to the other element or connected to the other element through a third element. On the other hand, when it is described that an element is "directly connected" to another element, it should be understood that the element is connected to the other element through no third element.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

Figure 2:
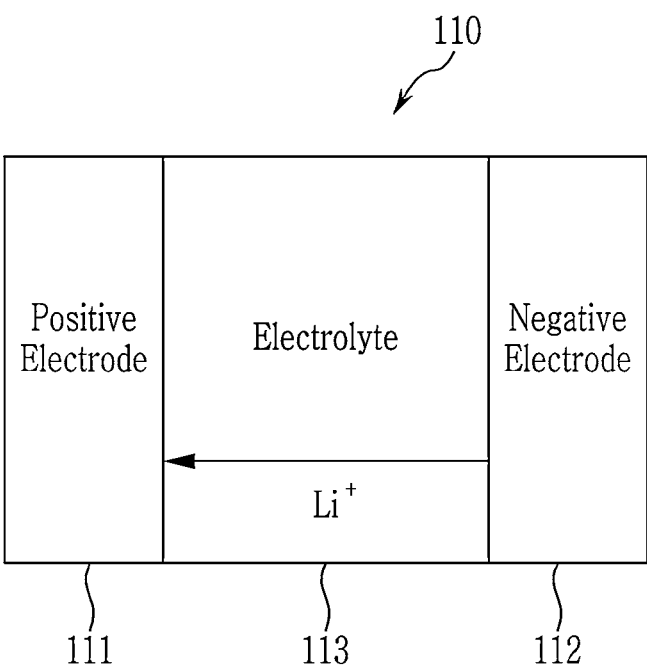
FIG. 2 is a diagram showing a structure of a battery according to an embodiment.
Figure 3:
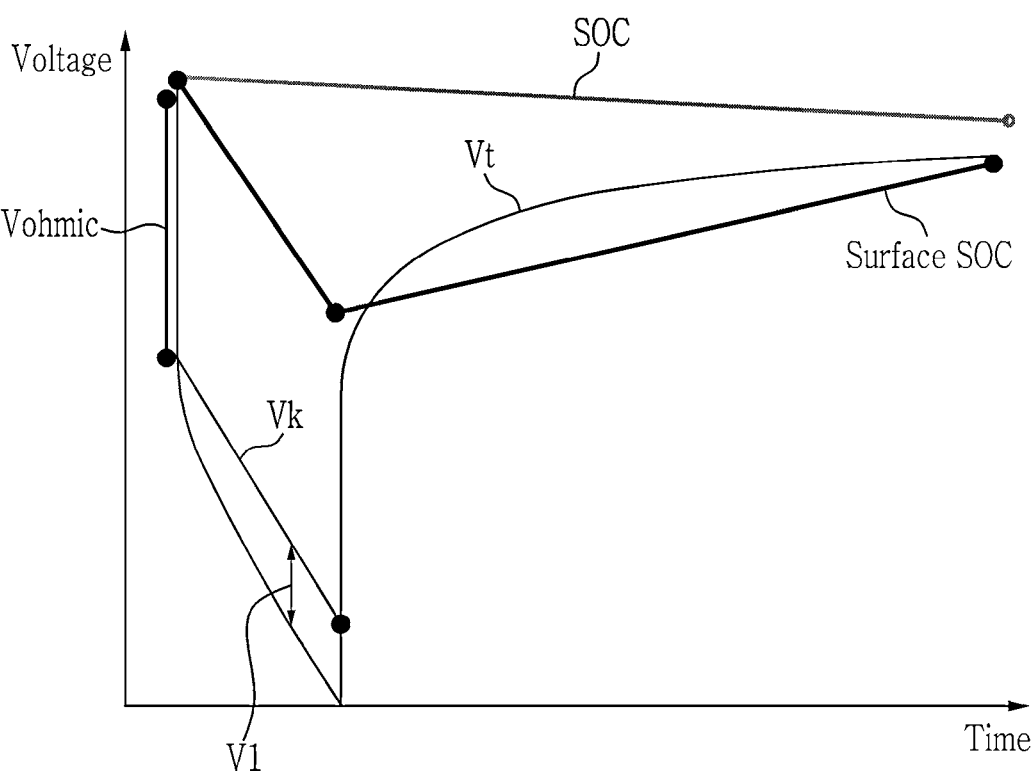
FIG. 3 is a diagram showing an example of a state change in a battery.

FIG. 1 is a drawing showing a battery apparatus according to an embodiment, FIG. 2 is a diagram showing a structure of a battery according to an embodiment, and FIG. 3 is a diagram showing an example of a state change in a battery.

Referring to FIG. 1, a battery apparatus 100 has a structure that can be electrically connected to an external apparatus. When the external apparatus is a load, the battery apparatus 100 is discharged by operating as a power supply that supplies power to the load. When the external apparatus is a charger, the battery apparatus 100 is charged by receiving external power through the charger. The external apparatus operating as the load may be, for example, an electronic device, a mobility apparatus, or an energy storage system (ESS). The mobility apparatus may be, for example, a vehicle such as an electric vehicle, a hybrid vehicle, or a smart mobility.

The battery apparatus 100 includes a battery 110, a voltage measuring circuit 120, a temperature sensor 130, a current sensor 140, and a processor 150.

The battery 110 is a rechargeable battery. The battery 100 may be, for example, a lithium battery such as a lithium ion battery or a lithium ion polymer battery, or a nickel battery such as a nickel-cadmium (NiCd) battery or a nickel-metal hydride (NiMH) battery. In some embodiments, the battery 100 may be a single battery cell, a battery module including an assembly of a plurality of battery cells or in which a plurality of assemblies are connected in series or parallel, a battery pack in which a plurality of battery modules are connected in series or parallel, or a system in which a plurality of battery packs are connected in series or parallel.

The voltage measuring circuit 120 measures a voltage of the battery 110. In some embodiments, the voltage measurement circuit 120 may measure a voltage of each battery cell.

The temperature sensor 130 measures a temperature of the battery 110. In some embodiments, the temperature sensor 130 may measure a temperature at a predetermined location of the battery 110. In some embodiments, a plurality of temperature sensors 130 may be provided to measure temperatures at a plurality of locations in the battery 110.

The current sensor 140 is connected to a positive output terminal or negative output terminal of the battery 110, and measures a current of the battery 110, i.e., a charging current or a discharging current.

The processor 150 estimates a state of the battery 110 based on the voltage of the battery 110 measured by the voltage measuring circuit 120, the temperature of the battery 110 measured by the temperature sensor 130, or the current of the battery 110 measured by the current sensor 140. In some embodiments, the battery apparatus 100 may further include a memory 160 that stores data necessary for state estimation in the processor 150.

In some embodiments, the processor 150 may form a battery management system. In some embodiments, the battery management system may further include at least one of the voltage measurement circuit 120, the temperature sensor 130, or the current sensor 140.

Referring to FIG. 2, the battery 110 includes a positive electrode (or cathode) 111, a negative electrode (or anode) 112, and an electrolyte 113. A structure of the battery 110 shown in FIG. 2 is a schematic example for convenience of description, and the structure of the battery 110 is not limited thereto. In FIG. 2, for convenience, it is assumed that lithium is an active material causing a chemical reaction in the battery 110.

When the battery 110 is discharged in order to supply power from the battery 110 to an external apparatus, as shown in FIG. 2, a chemical reaction (oxidation reaction) in which a lithium ion $Li^+$ are discharged from the negative electrode 112 may occur on a surface of the negative electrode 112. The discharged lithium ion $Li^+$ may pass through the electrolyte 113 and then move to a surface of the positive electrode 111. Accordingly, a chemical reaction (reduction reaction) in which the lithium ion $Li^+$ is absorbed into the positive electrode 111 may occur on the surface of the positive electrode 111.

When the battery 110 is charged, a chemical reaction (oxidation reaction) in which a lithium ion $Li^+$ is discharged from the positive electrode 111 may occur on a boundary surface between the positive electrode 111 and the electrolyte 113. The discharged lithium ion $Li^+$ may pass through the electrolyte 113 and then move to the surface of the negative electrode 112. Accordingly, a chemical reaction (reduction reaction) in which the lithium ion $Li^+$ is absorbed into the negative electrode 112 may occur on the surface of the negative electrode 112.

A terminal voltage of the battery 110 may be appeared in a form of summing a potential at a battery electrode surface corresponding to the positive electrode 111 and the negative electrode 112, voltage drop due to an ohmic resistance (internal resistance) formed by the electrolyte 113 and the like, and an over-potential due to electrochemical reaction. The overpotential may represent voltage drop occurred by deviation from an equilibrium potential due to polarization at each battery electrode. The overpotential is also called a polarization voltage.

As shown in FIG. 3, when the battery 110 starts discharging, the terminal voltage Vt of the battery 110 momentarily drops due to the voltage drop Vohmic by the ohmic resistance Rohmic, and then gradually decreases due to a transient change V1 of the overpotential. In general, the transient change V1 of the overpotential may be expressed as a change depending on a time constant defined in a parallel circuit of a resistor and a capacitor. At this time, the actual terminal voltage Vt of the battery 110 decreases with a constant slope along with the transient change V1 of the overpotential. That is, as shown in FIG. 3, a decrease Vk according to the constant slope and a decrease V1 according to the transient change of the overpotential appear together. This slope is determined by a magnitude of a current flowing through the battery 110. As described above, the phenomenon in which the terminal voltage Vt of the battery 110 decreases with the certain slope occurs because concentration of the active material on the electrode surface due to an oxidation/reduction reaction of the active material is lower than an average concentration. That is, the voltage change Vk according to the constant slope may occur by a voltage change (change due to discharging or charging) caused by an oxidation/reduction reaction rate and a voltage change caused by a diffusion resistance (concentration difference) in a relaxation period after the current disappears.

In general, a state of the battery 110 is determined as a state of charge (SOC) representing an average concentration at the whole of the battery 110, and the terminal voltage Vt of the battery 110 is estimated based on the open circuit voltage of the battery 110, the voltage drop (Vohmic) due to the ohmic resistance (Rohmic), and the overpotential. At this time, the open circuit voltage is estimated based on the SOC of the battery 110. However, the SOC represents the average concentration (e.g., the average concentration at the electrode) inside the battery 110 rather than the concentration on the surface of the battery electrode, and gradually decreases when the battery 110 is discharged as shown in FIG. 3. Therefore, when the open circuit voltage of the battery 110 is estimated based on the SOC, the terminal voltage of the battery 110 may not be accurately estimated. Accordingly, in some embodiments, a surface state of charge (SOC) capable of determining the potential at the electrode surface of the battery 110 is provided. Such a surface SOC may represent the concentration of the active material on the electrode surface of the battery 110.

Figure 4:
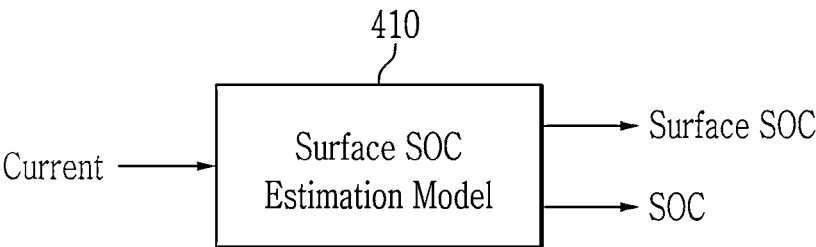
FIG. 4 is a diagram for explaining surface SOC estimation in a battery management system according to an embodiment.

FIG. 4 is a diagram for explaining surface SOC estimation in a battery management system according to an embodiment, FIG. 5 is a diagram showing an example of a correspondence relationship between a temperature/SOC and a kinetics coefficient in a battery according to an embodiment, and FIG. 6 is a diagram showing an example of a correspondence relationship between a temperature/SOC and a diffusion coefficient in a battery according to an embodiment.

Referring to FIG. 4, a processor (e.g., 150 in FIG. 1) of a battery management system may estimate a surface SOC of a battery (e.g., 110 in FIG. 1) based on measured information of the battery 110 including a current of the battery 110, using a surface SOC estimation model 410. In some embodiments, the surface SOC may be estimated as a percentage. In some embodiments, the processor 150 may estimate an SOC of the battery 110 representing an average concentration based on the measured information of the battery including the current of the battery 110, using the surface SOC estimation model 410.

As described with reference to FIG. 3, when the battery 110 is discharged, a terminal voltage of the battery 110 may decrease with a certain slope. Since the phenomenon in which the terminal voltage of the battery 110 decrease with the certain slope occurs because concentration of an active material on an electrode surface decreases by an oxidation/reduction reaction of the active material, the certain slope is proportional to the current of the battery 110. Accordingly, the surface SOC estimation model 410 may estimate the surface SOC based on the reaction rate determined by the current of the battery 110. In some embodiments, a reaction rate (kinetics) may be determined based on a value obtained by reflecting a specific coefficient to the current of the battery 110. Hereinafter, such a specific factor is referred to as a "kinetics coefficient". In one embodiment, the reaction rate may be determined based on a product of the current of the battery 110 and the kinetics coefficient.

The reaction rate of the oxidation/reduction reaction may be determined by the temperature of the battery 110 and the average concentration inside the battery 110. Thus, in some embodiments, the kinetics coefficient may vary depending on the temperature of the battery 110 and the SOC of the battery 110. In one embodiment, the SOC of the battery 110 may include the SOC of the battery 110 representing the average concentration. In another embodiment, the SOC of the battery 110 may include the surface SOC of the battery 110. In yet another embodiment, the SOC of the battery 110 may include the SOC of the battery 110 representing the average concentration and the surface SOC of the battery 110. That is, the surface SOC estimation model 410 may determine the kinetics coefficient based on the temperature of the battery 110 and the SOC of the battery 110. In some embodiments, as shown in FIG. 5, a correspondence relationship between the temperature/SOC of the battery 110 and the kinetics coefficient may be predefined through experiments. In some embodiments, a memory of the battery management system may store such correspondence relationship, for example, in the form of a lookup table. In some embodiments, the surface SOC estimation model 410 may determine the kinetics coefficient based on either the temperature of the battery 110 or the SOC of the battery 110.

When the concentration on the electrode surface is lower than the average concentration by the oxidation/reduction reaction on the electrode surface, a resistance component in which the reaction on the electrode surface is lowered by a diffusion rate caused by a concentration difference between the concentration on the electrode surface and the average concentration may appear. Such a resistance caused by the diffusion (hereinafter referred to as a "diffusion resistance") may be expressed as a force that suppresses the oxidation/reduction reaction in a reverse direction. Therefore, the surface SOC estimation model 410 additionally reflects the diffusion resistance when estimating the surface SOC. In some embodiments, the diffusion resistance may be determined based on a difference between the SOC representing the average concentration and the surface SOC representing the concentration on the electrode surface. In some embodiments, the surface SOC estimation model 410 may estimate the surface SOC based on a value obtained by reflecting a specific coefficient to the difference between the SOC and the surface SOC. Hereinafter, such a specific coefficient is referred to as a "diffusion coefficient". In one embodiment, the surface SOC estimation model 410 may estimate the surface SOC based on a product of the diffusion coefficient and the difference between the SOC and the surface SOC.

The reaction rate of the oxidation/reduction reaction may be determined based on the temperature of the battery 110 and the average concentration inside the battery 110. Thus, in some embodiments, the diffusion coefficient that suppresses the oxidation/reduction reaction may vary depending on the temperature of the battery 110 and the SOC of the battery 110. In one embodiment, the SOC of the battery 110 may include the SOC of the battery 110 representing an average concentration. In another embodiment, the SOC of the battery 110 may include the surface SOC of the battery 110. In yet another embodiment, the SOC of the battery 110 may include the SOC of the battery 110 representing the average concentration and the surface SOC of the battery 110. That is, the surface SOC estimation model 410 may determine the diffusion coefficient based on the temperature of the battery 110 and the SOC of the battery 110. In some embodiments, as shown in FIG. 6, a correspondence relationship between the temperature/SOC of the battery 110 and the diffusion coefficient may be predefined through experiments. In some embodiments, the memory of the battery management system may store the correspondence relationship, for example, in the form of a lookup table. In some embodiments, the surface SOC estimation model 410 may determine the diffusion coefficient based on either temperature of the battery 110 or the SOC of the battery 110.

In some embodiments, the surface SOC estimation model 410 may estimate the surface SOC at a current time point by reflecting at least a change due to the reaction rate from a previous time point to the current time point and a change due to the diffusion resistance from the previous time point to the current time point to the surface SOC estimated at the previous time point. In some embodiments, the processor 150 may predefine an initial value SSOC[0] of the surface SOC for estimating the surface SOC.

Figure 7:
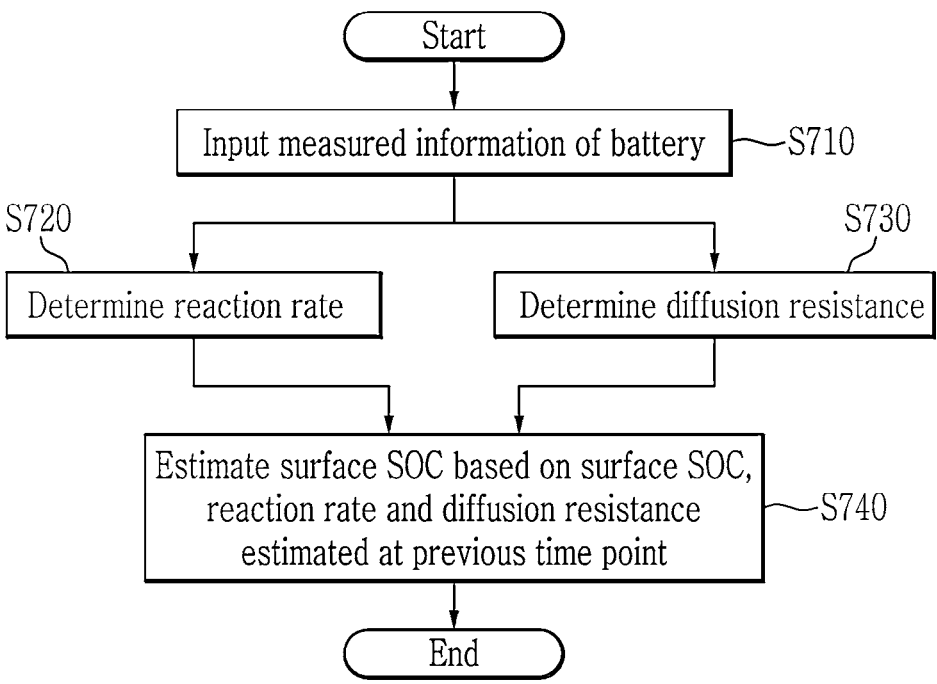
FIG. 7 is a flowchart showing a surface SOC estimation method in a battery management system according to an embodiment.

FIG. 7 is a flowchart showing a surface SOC estimation method in a battery management system according to an embodiment.

Referring to FIG. 7, a processor (e.g., 150 in FIG. 1) inputs measured information of a battery (e.g., 110 in FIG. 1) to a surface SOC estimation model at S710. The measured information of the battery 110 may include a current of the battery 110. In some embodiments, the current of the battery 110 may be a charging or discharging current of the battery 110 measured by a current sensor (e.g., 140 in FIG. 1). In some embodiments, the measured information of the battery 110 may further include a measured voltage of the battery 110. In some embodiments, the measured voltage of the battery 110 may be an average cell voltage, and the average cell voltage may be an average value of voltages of a plurality of battery cells. In some embodiments, the measured voltage of the battery 110 may be a sum of voltages of the plurality of battery cells. In some embodiments, the measured information of the battery 110 may further include a temperature of the battery 110. In some embodiments, the temperature of the battery 110 may be a temperature measured by a temperature sensor (e.g., 130 in FIG. 1).

The processor 150 determines a plurality of parameters at time point t using the surface SOC estimation model at S720 and S730. The plurality of parameters may include a parameter corresponding to a reaction rate and a parameter corresponding to a diffusion resistance.

The processor 150 determines the reaction rate $K[t]$ of the battery 110 at time point t using the surface SOC estimation model at S720. The processor 150 may calculate the reaction rate $K[t]$ as a product $Kc*I[t]$ of a kinetics coefficient $Kc$ and the temperature of the battery 110 at time point t. In some embodiments, the processor 110 may extract the kinetics coefficient $Kc$ corresponding to the temperature of the battery 110 and the SOC of the battery 110 from a memory. In some embodiments, the memory may be a memory (e.g., 160 in FIG. 1) of a battery management system. In some embodiments, the processor 150 may estimate the SOC of the battery 110 based on the measured information of the battery 110. In some embodiments, the processor 150 may estimate the SOC using any one of various known methods, and the present invention is not limited to the method of estimating the SOC.

In addition, the processor 150 determines the diffusion resistance $D[t]$ of the battery 110 at time point t using the surface SOC estimation model at S730. The processor 150 may calculate the diffusion resistance $D[t]$ as a product $Dc*\Delta SOC[t]$ of a difference $\Delta SOC[t]$ between the SOC and the surface SOC at time point t and the diffusion coefficient $Dc$. In some embodiments, the processor 110 may extract the diffusion coefficient $Dc$ corresponding to the temperature of the battery 110 and the SOC of the battery 110 from the memory. In some embodiments, the memory may be the memory 160 of the battery management system.

Next, at S740, the processor 150 estimates the surface SOC SSOC[t+1] at the time point (t+1) based on the surface SOC SSOC[t], the reaction rate K[t], and the diffusion resistance D[t] estimated at time point t, using the surface SOC estimation model. In some embodiments, the processor 150 may estimate the surface SOC SSOC[t+1] as in Equation 1 or 2.

$$SSOC[t+1]=SSOC[t]+(K[t]+D[t])\cdot\Delta t \qquad \text{Equation 1}$$

$$SSOC[t+1]=SSOC[t]+(Kc\cdot I[t]+Dc\cdot\Delta SOC[t])\cdot\Delta t \qquad \text{Equation 2}$$

In Equations 1 and 2, $\Delta t$ denotes a time change (time difference) between time point (t+1) and time point t.

In some embodiments, the surface SOC estimation model may accurately estimate the surface SOC by repeatedly performing the estimation of the surface SOC. In some embodiments, an adaptive filter may be used as the surface SOC estimation model.

According to above-described embodiments, the state of the battery 110 can be accurately estimated by using the surface SOC that can accurately represent the potential of the electrode surface of the battery 110.

Next, embodiments of estimating a terminal voltage of the battery 110 using a surface SOC are described with reference to FIG. 8, FIG. 9, and FIG. 10.

Figure 8:
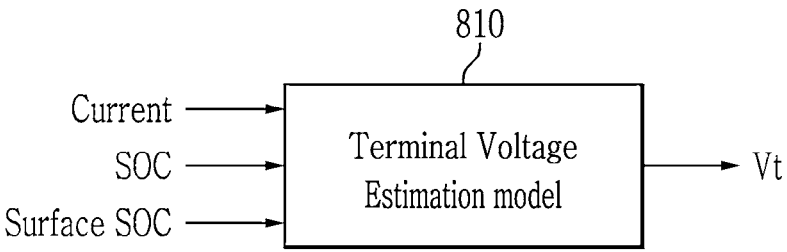
FIG. 8 is a diagram for explaining battery terminal voltage estimation in a battery management system according to an embodiment.
Figure 9:
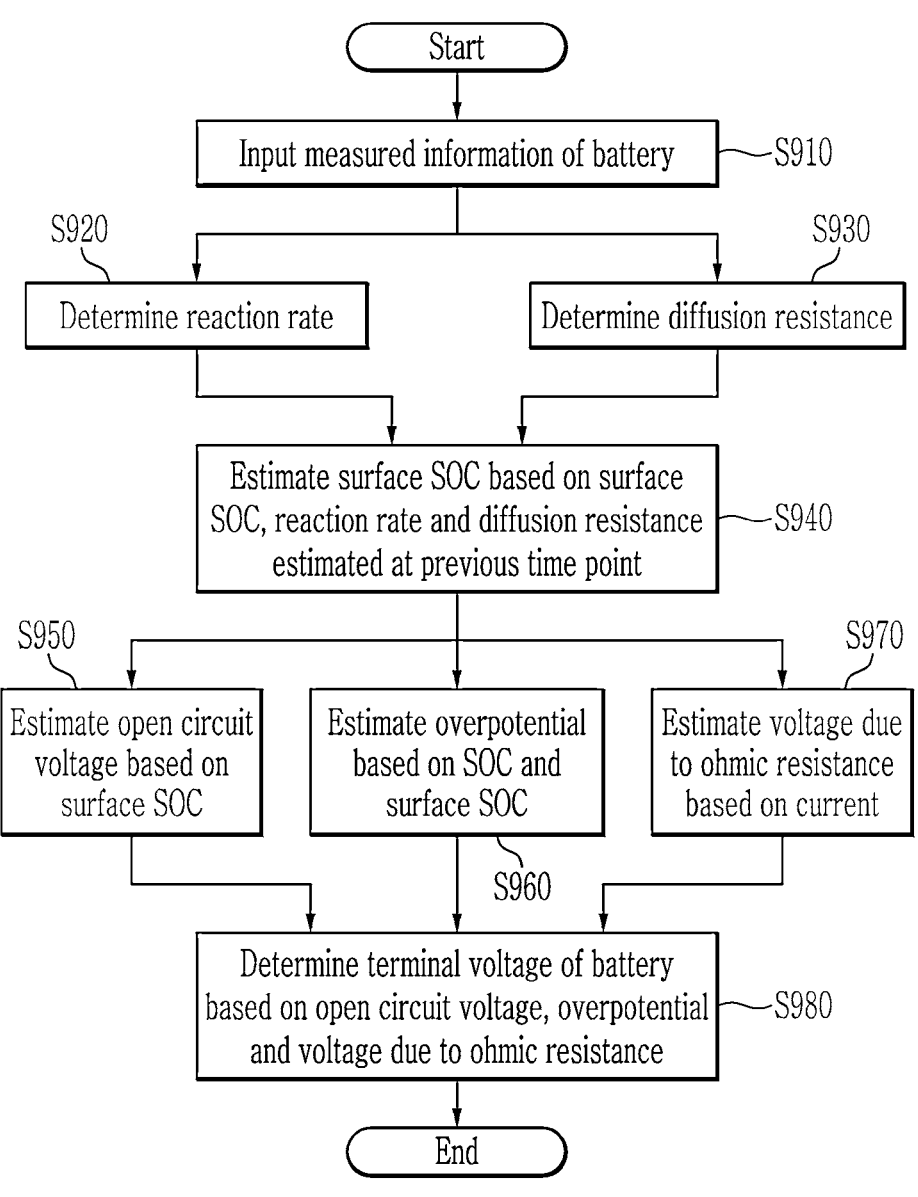
FIG. 9 is a flowchart showing a battery terminal voltage estimation method in a battery management system according to an embodiment.
Figure 10:
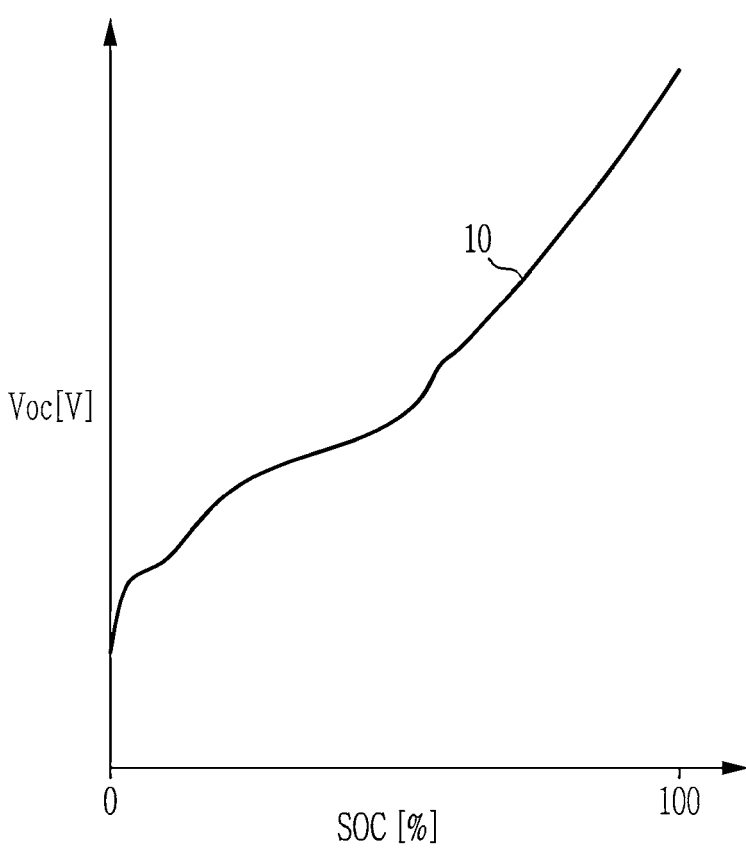
FIG. 10 is a diagram showing an example of a correspondence relationship between an SOC and an open circuit voltage in a battery according to an embodiment.

FIG. 8 is a diagram for explaining battery terminal voltage estimation in a battery management system according to an embodiment, FIG. 9 is a flowchart showing a battery terminal voltage estimation method in a battery management system according to an embodiment, and FIG. 10 is a diagram showing an example of a correspondence relationship between an SOC and an open circuit voltage in a battery according to an embodiment.

Referring to FIG. 8 and FIG. 9, a processor (e.g., 150 of FIG. 1) estimates a surface SOC using a surface SOC estimation model (e.g., 410 of FIG. 4). That is, as described with reference to FIG. 7, the processor inputs measured information of the battery (110 in FIG. 1) to the surface SOC estimation model 410 at S910, calculates a reaction rate K[t] and a diffusion resistance D[t] of the battery 110 at S920 and S930, and estimate the surface SOC SSOC[t+1] based on the reaction rate K[t] and the diffusion resistance D[t] at S940.

Next, the processor 150 inputs the SOC, the surface SOC, and a current of the battery 110 to a terminal voltage estimation model 810, and estimates a terminal voltage of the battery 110 using the terminal voltage estimation model 810.

To this end, the processor 150 estimates an open circuit voltage of the battery 110 based on the surface SOC at S950. The processor 150 may estimate the open circuit voltage Voc based on a non-linear functional relationship Voc=f(SSOC) between the surface SOC SSOC and the open circuit voltage Voc. In general, a memory (e.g., 160 in FIG. 1) of the battery management system stores a correspondence relationship between the open circuit voltage Voc of the battery 110 and the SOC of the battery 110 in advance. For example, the correspondence relationship between the open circuit voltage Voc and the SOC may be defined as shown in FIG. 10. In this case, the processor 150 determines the open circuit voltage Voc by inputting the surface SOC instead of the SOC. For example, when the surface SOC is 70%, the processor 150 may extract an open circuit voltage corresponding to the SOC of 70% from the memory. In some embodiments, the correspondence relationship between the open circuit voltage and the SOC may be stored per temperature. In this case, the processor 150 may determine the open circuit voltage based on the correspondence relationship between the SOC and the open circuit voltage, corresponding to the temperature of the battery 110, among various correspondence relationships.

Further, the processor 150 estimates an overpotential due to polarization at S960. Since the overpotential is caused by deviation of a potential at an electrode surface from an equilibrium potential, the processor 150 estimates the overpotential based on the surface SOC representing the potential at the electrode surface and the SOC representing the equilibrium potential. In some embodiments, the processor 150 may estimate the overpotential based on a value obtained by comparing the SOC and the surface SOC. In one embodiment, the value obtained by comparing the SOC and the surface SOC may be a ratio of the SOC and the surface SOC. In another embodiment, the value obtained by comparing the SOC and the surface SOC may be a difference between the SOC and the surface SOC. In some embodiments, the processor 150 may estimate the overpotential V1[t+1] at time point (t+1) based on the overpotential V1[t], the SOC SOC[t], and the surface SOC SSOC[t] at time point t, using the terminal voltage estimation model 810. In some embodiments, the processor 150 may estimate the overpotential V1[t+1], for example, as in Equation 3.

$$V1[t+1]=V1[t]+\alpha\cdot(SOC[t]/SSOC[t]) \qquad \text{Equation 3}$$

In Equation 3, a denotes an overpotential coefficient.

In some embodiments, the overpotential coefficient $\alpha$ may be determined by experiments. In some embodiments, the overpotential coefficient $\alpha$ may be determined by repeatedly performing overpotential estimation using an adaptive filter. In some embodiments, the processor 150 may predefine an initial value V1[0] of the overpotential for estimating the overpotential.

In addition, the processor 150 estimates a voltage due to an ohmic resistance of the battery 110 at S970. The processor 150 estimates the voltage Vohmic due to the ohmic resistance as a product of the ohmic resistance of the battery 110 and the current of the battery 110. In some embodiments, the processor 150 may estimate the ohmic resistance using any one of various known methods, and the present invention is not limited to the method for estimating the ohmic resistance.

Next, the processor 150 determines the terminal voltage of the battery 110 based on the open circuit voltage Voc, the overpotential V1, and the voltage Vohmic due to the ohmic resistance at S980. In some embodiments, as shown in Equation 4, the processor 150 may determine a sum of the open circuit voltage Voc, the overpotential V1, and the voltage Vohmic by the ohmic resistance as the terminal voltage Vt of the battery 110.

$$Vt=Voc+V1+Vohmic \qquad \text{Equation 4}$$

While the surface SOC estimating method or the terminal voltage estimating method has been described in a case of discharging the battery, the surface SOC estimating method or the terminal voltage estimating method according to above-described embodiments may be applied to a case of charging the battery. As shown in FIG. 3, in the discharging, the surface SOC representing the surface concentration appears lower than the SOC representing the average concentration, whereas in the charging, the surface SOC may appear higher than the SOC.

Figure 11:
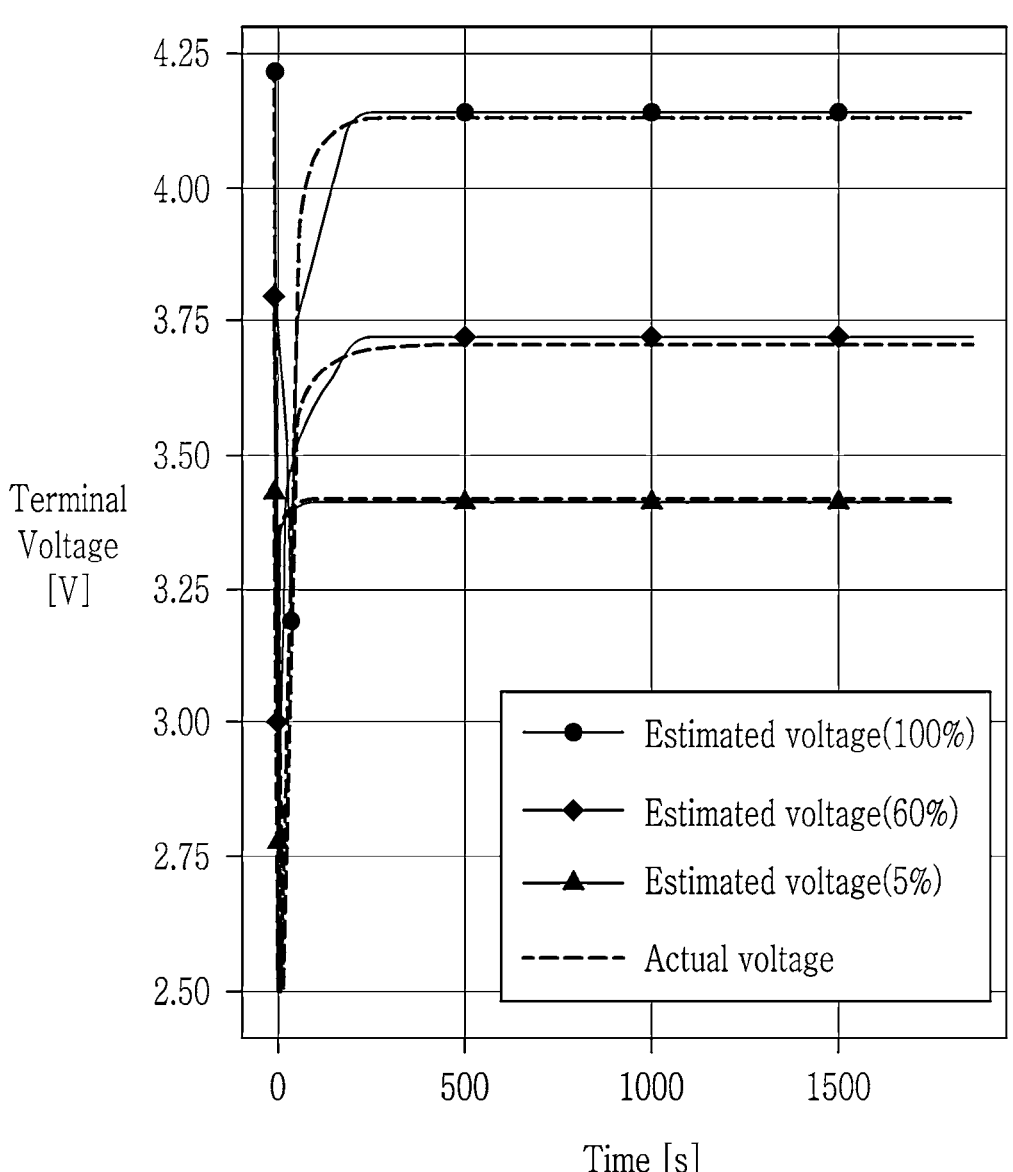
FIG. 11 and FIG. 12 are diagrams showing a relationship between a terminal voltage estimated by a battery terminal voltage estimation method according to an embodiment and an actual terminal voltage.
Figure 12:
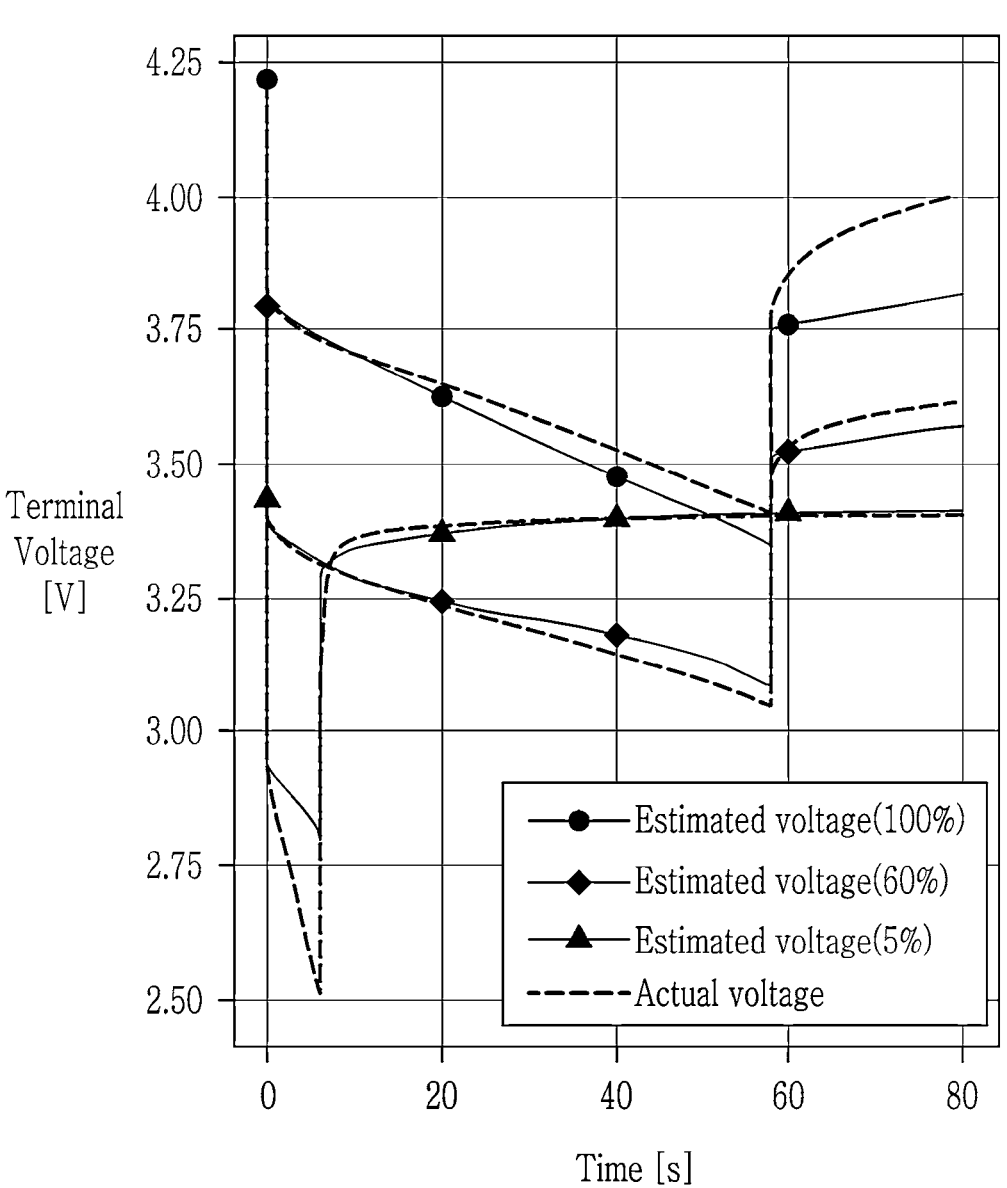

FIG. 11 and FIG. 12 are diagrams showing a relationship between a terminal voltage estimated by a battery terminal voltage estimation method according to an embodiment and an actual terminal voltage. FIG. 11 and FIG. 12 show an estimated terminal voltage and an actual terminal voltage when a surface SOC is 5%, 60%, and 100%, FIG. 11 shows the terminal voltage during charging of the battery, and FIG. 12 shows the terminal voltage during discharging of the battery.

As shown in FIG. 11 and FIG. 12, it can be seen that the terminal voltage (solid line) estimated by the battery terminal voltage estimation method according to an embodiment changes similarly to the actual terminal voltage (dashed line).

According to the above-described embodiments, by estimating the surface SOC representing the potential at the electrode surface based on the current of the battery and the oxidation/reduction reaction of the active material, it is possible to accurately estimate the state of the battery not only in a static state of the battery but also in a dynamic state in which charging or discharging is repeated.

In some embodiments, a processor (e.g., 150 of FIG. 1) may perform computation on a program for executing the surface SOC estimation method or terminal voltage estimation method described above. A program for executing the surface SOC estimation method or the terminal voltage estimation method may be loaded into a memory. The memory may be the same memory as a memory (e.g., 160 in FIG. 1) for storing a table or a separate memory. The program may include instructions for causing the processor 150 to perform the surface SOC estimation method or the terminal voltage estimation method when loaded into a memory. That is, the processor may perform an operation for the surface SOC estimation method or the terminal voltage estimation method by executing the instructions of the program.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery apparatus, comprising:
a battery electrically connected to a first external apparatus or a second external apparatus and in a dynamic state of being charged by the first external apparatus or being discharged to supply power to the second external apparatus;
a current sensor connected to an output terminal of the battery and configured to measure a current of the battery in the dynamic state; and
a processor configured to:
receive the measured current of the battery in the dynamic state; and
estimate a surface state of charge (SOC) representing a potential at an electrode surface of the battery in the dynamic state based on a plurality of parameters, the plurality of parameters including a first parameter determined based on the measured current and a second parameter determined based on a state of charge (SOC) of the battery,
wherein the processor is further configured to determine the second parameter based on a difference between the SOC and the surface SOC that are estimated at a previous time point.

2. The battery apparatus of claim 1, wherein the processor is further configured to:
determine a coefficient based on at least one of a temperature of the battery, the SOC, and the surface SOC; and
determine the first parameter by reflecting the coefficient to the measured current.

3. The battery apparatus of claim 2, further comprising a memory configured to store a correspondence relationship between the coefficient and at least one of the temperature of the battery, the SOC, and the surface SOC,
wherein the processor is further configured to determine the coefficient based on the correspondence relationship.

4. The battery apparatus of claim 1, wherein the processor is further configured to:
determine a coefficient based on at least one of a temperature of the battery, the SOC, and the surface SOC; and
determine the second parameter by reflecting the coefficient to the difference between the SOC and the surface SOC.

5. The battery apparatus of claim 4, further comprising a memory configured to store a correspondence relationship between the coefficient and at least one of the temperature of the battery, the SOC, and the surface SOC,
wherein the processor is further configured to determine the coefficient based on the correspondence relationship.

6. The battery apparatus of claim 1, wherein the processor is further configured to estimate the surface SOC at a current time point based on the surface SOC, the first parameter, and the second parameter that are estimated at the previous time point.

7. The battery apparatus of claim 6, wherein the processor is further configured to reflect a time change between the previous time point and the current time point to the first parameter and the second parameter, respectively.

8. The battery apparatus of claim 1, wherein the processor is further configured to estimate a terminal voltage of the battery based on the surface SOC, the SOC, and the measured current of the battery.

9. The battery apparatus of claim 8, wherein the processor is further configured to:
estimate an open circuit voltage of the battery based on the surface SOC;
estimate an overpotential of the battery based on the SOC and the surface SOC;
estimate a voltage due to an ohmic resistance of the battery based on the measured current of the battery; and
estimate the terminal voltage based on the open circuit voltage, the overpotential, and the voltage due to the ohmic resistance.

10. The battery apparatus of claim 9, further comprising a memory configured to store a correspondence relationship between the SOC as an input and the open circuit voltage as an output,
wherein the processor is further configured to estimate the open circuit voltage using the surface SOC as the input of the correspondence relationship.

11. The battery apparatus of claim 9, wherein the processor is further configured to estimate the overpotential based on a ratio or difference between the SOC and the surface SOC.

12. A method of estimating a state of a battery electrically connected to a first external apparatus or a second external apparatus and in a dynamic state of being charged by the first external apparatus or being discharged to supply power to the second external apparatus, the method comprising:

measuring, by a current sensor connected to an output terminal of the battery, a current of the battery in the dynamic state;

determining, by a processor, a first parameter based on the measured current of the battery in the dynamic state;

determining, by the processor, a second parameter based on a state of charge (SOC) of the battery; and estimating, by the processor, a surface state of charge (SOC) representing a potential at an electrode surface of the battery in the dynamic state based on a plurality of parameters, the plurality of parameters including the first parameter determined based on the measured current and the second parameter, wherein the determining of the second parameter by the processor includes determining the second parameter based on a difference between the SOC and the surface SOC that are estimated at a previous time point.

13. The method of claim 12, wherein the determining of the first parameter by the processor includes:

determining a coefficient based on at least one of a temperature of the battery, the SOC, and the surface SOC; and determining the first parameter by reflecting the coefficient to the measured current.

14. The method of claim 12, wherein the determining of the second parameter by the processor includes:

determining a coefficient based on at least one of a temperature of the battery, the SOC, and the surface SOC; and determining the second parameter by reflecting the coefficient to the difference between the SOC and the surface SOC at the previous time point.

15. The method of claim 12, wherein the estimating of the surface SOC by the processor includes estimating the surface SOC at a current time point based on the surface SOC, the first parameter, and the second parameter that are estimated at the previous time point.

16. The method of claim 12, further comprising:

estimating, by the processor, a first voltage based on the surface SOC;

estimating, by the processor, a second voltage based on the SOC and the surface SOC;

estimating, by the processor, a third voltage based on the measured current of the battery; and estimating, by the processor, a terminal voltage of the battery based on the first voltage, the second voltage, and the third voltage.

17. A non-transitory computer readable medium containing computer instructions stored therein for causing a processor of a battery apparatus, comprising a battery electrically connected to a first external apparatus or a second external apparatus and in a dynamic state of being charged by the first external apparatus or being discharged to supply power to the second external apparatus, and comprising a current sensor connected to an output terminal of the battery and configured to measure a current of the battery in the dynamic state, to perform:

determining a first parameter based on the measured current of the battery in the dynamic state;

determining a second parameter based on a state of charge (SOC) of the battery; and estimating a surface state of charge (SOC) representing a potential at an electrode surface of the battery in the dynamic state based on a plurality of parameters, the plurality of parameters including the first parameter and the second parameter, wherein the determining of the second parameter includes determining the second parameter based on a difference between the SOC and the surface SOC that are estimated at a previous time point.

* * * * *